(12) United States Patent
Takizawa et al.

(10) Patent No.: US 10,797,003 B2
(45) Date of Patent: Oct. 6, 2020

(54) CIRCUIT MODULE

(71) Applicant: TDK Corporation, Tokyo (JP)

(72) Inventors: Shuichi Takizawa, Tokyo (JP); Hironori Sato, Tokyo (JP); Atsushi Yoshino, Tokyo (JP)

(73) Assignee: TDK CORPORATION, Tokyo (JP)

( * ) Notice: Subject to any disclaimer, the term of this patent is extended or adjusted under 35 U.S.C. 154(b) by 40 days.

(21) Appl. No.: 16/284,457

(22) Filed: Feb. 25, 2019

(65) Prior Publication Data

US 2019/0267330 A1 Aug. 29, 2019

(30) Foreign Application Priority Data

Feb. 27, 2018 (JP) .................................. 2018-033427

(51) Int. Cl.
| | | |
|---|---|---|
| *H01L 23/552* | (2006.01) |
| *H03H 9/02* | (2006.01) |
| *H01G 4/30* | (2006.01) |
| *H01G 4/12* | (2006.01) |
| *H01G 2/22* | (2006.01) |

(52) U.S. Cl.
CPC ............ *H01L 23/552* (2013.01); *H01G 2/22* (2013.01); *H01G 4/12* (2013.01); *H01G 4/30* (2013.01); *H03H 9/02913* (2013.01)

(58) Field of Classification Search
None
See application file for complete search history.

(56) References Cited

U.S. PATENT DOCUMENTS

| 2007/0222077 A1* | 9/2007 | Ogihara ................... B41J 2/45 257/758 |
| 2010/0071940 A1* | 3/2010 | Ejiri .................. H01L 23/49816 174/257 |
| 2010/0172116 A1 | 7/2010 | Yorita et al. |
| 2012/0292772 A1 | 11/2012 | Yorita et al. |
| 2015/0351237 A1* | 12/2015 | Scholz ................. H05K 1/0373 174/255 |
| 2015/0382478 A1* | 12/2015 | Shimada ................ H05K 1/185 361/761 |

FOREIGN PATENT DOCUMENTS

JP 2010-114291 A 5/2010

* cited by examiner

*Primary Examiner* — Thao P Le
(74) *Attorney, Agent, or Firm* — Oliff PLC

(57) ABSTRACT

A circuit module 2 comprises: a wiring structure 4; an electronic component 6a, 6b arranged on the upper surface of the wiring structure 4; an insulating resin layer 8 which is provided on the upper surface of the wiring structure 4 and in which the electronic component 6a, 6b is embedded; and a metal layer 10 provided on a side surface S1 of the insulating resin layer 8 and a side surface S2 of the wiring structure 4. The surface roughness of the side surface S1 of the insulating resin layer 8 is expressed as R1. The surface roughness of the side surface S2 of the wiring structure 4 is expressed as R2. R1 and R2 differ from each other.

5 Claims, 4 Drawing Sheets

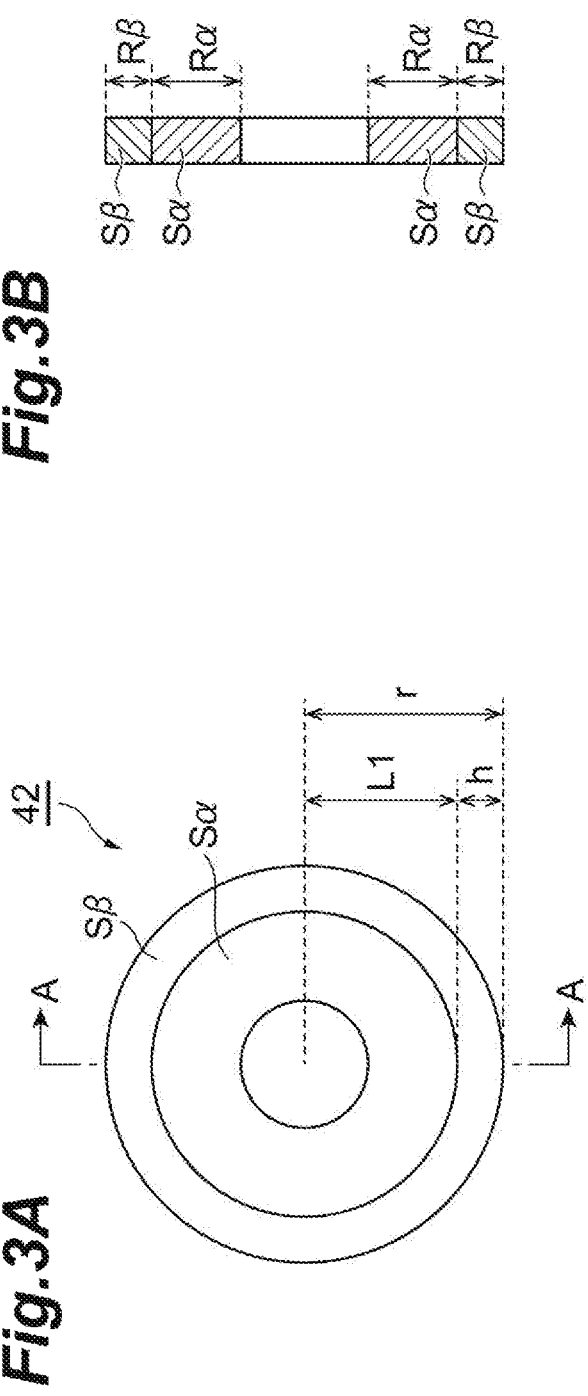
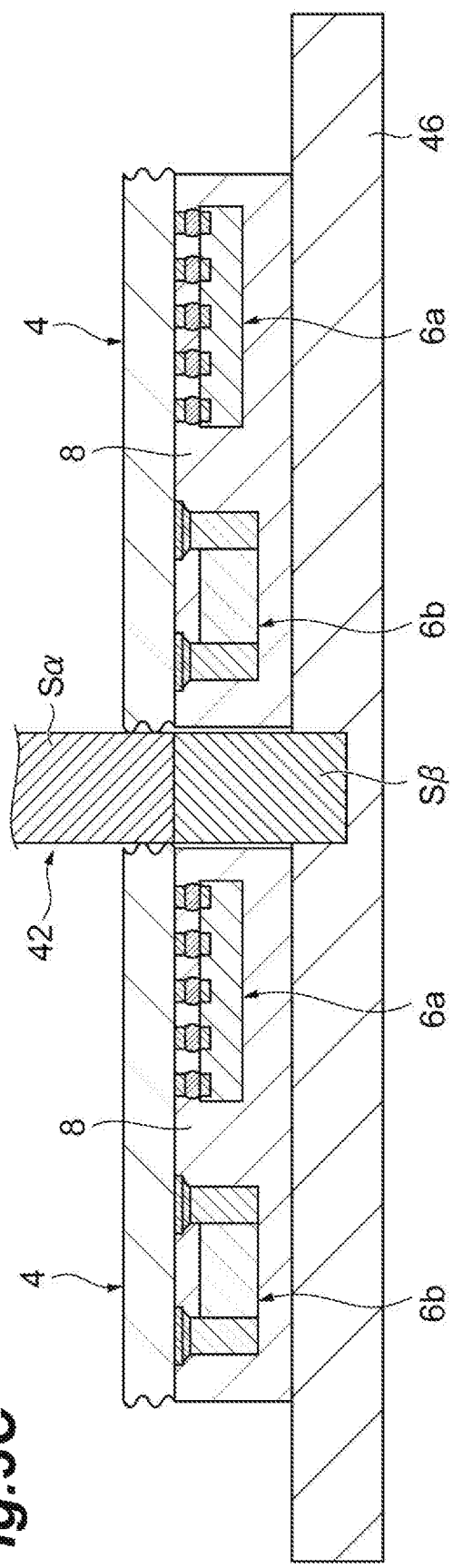
Fig.3A
Fig.3B
Fig.3C

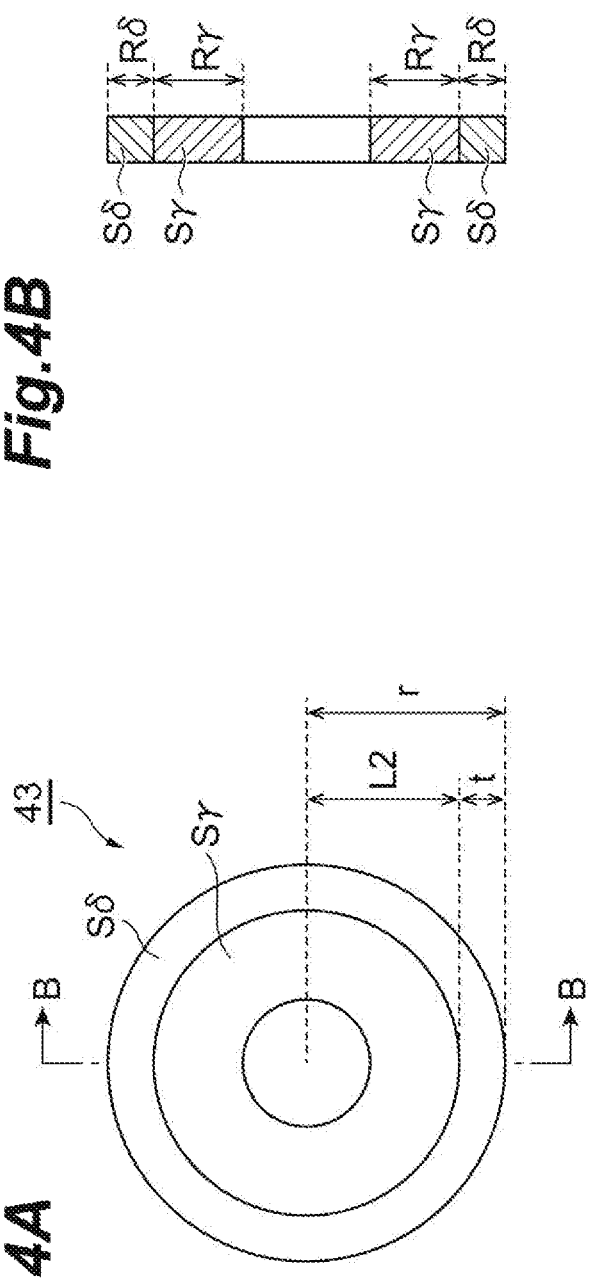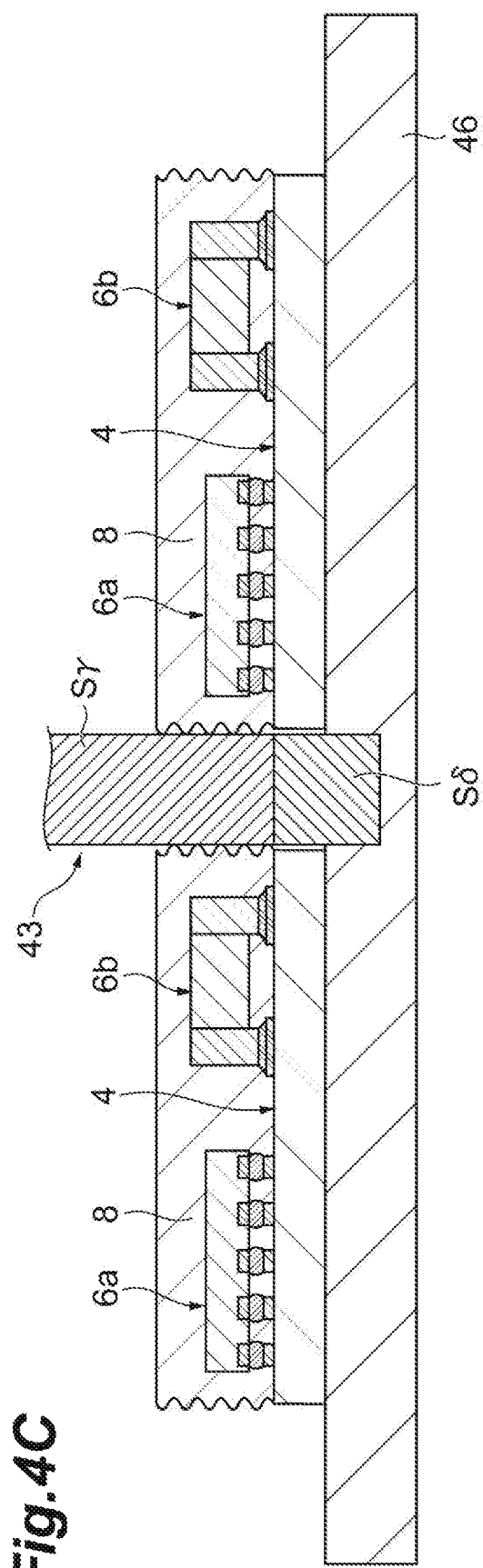

CIRCUIT MODULE

TECHNICAL FIELD

The present invention relates to a circuit module.

BACKGROUND

There is known a circuit module equipped with a wiring structure, an electronic component arranged on the upper surface of the wiring structure, and an insulating resin layer in which the electronic component is embedded. As is known, a metal layer is provided on the upper surface of the insulating resin layer for electromagnetic shielding of the electronic component.

CITATION LIST

Patent Literature

[Patent Document 1] Japanese Unexamined Patent Publication No. 2010-114291

SUMMARY

To electromagnetically shield the wiring structure and the electronic component, it might be possible to provide the metal layer from a side surface of the wiring structure to a side surface of the insulating resin layer. There is, however, a difference in CTE (coefficient of thermal expansion) between the wiring structure or the electronic component and the insulating resin layer, so that when heat processing is performed on the circuit module, stress is generated in the circuit module. When the stress is applied to the metal layer, the metal layer is made subject to separation from the wiring structure and the insulating resin layer. In particular, when the metal layer on the side surface of the wiring structure is separated, the electromagnetic shielding effect for the wiring structure is likely to be markedly deteriorated, and when the metal layer on the side surface of the insulating resin layer is separated, the electromagnetic shielding effect for the electronic component is likely to be markedly deteriorated. Since there is a difference in CTE between the wiring structure and the insulating resin layer, in the conventional circuit module, there is a difference in heat processing condition for the generation of separation, the degree of separation, etc. between the separation of the metal layer on the side surface of the wiring structure and the separation of the metal layer on the side surface of the insulating resin layer, and it is difficult to control the separation behavior of the metal layer on each side surface. In the case where the metal layer is utilized as a wiring layer, the stray capacitance between the electronic component or the wiring and the metal layer is changed, and the electrical characteristic in the high frequency range is allowed to be deviated against the design intention.

The present invention has been made in view of the above problem in the prior art technique. It is an object of the present invention to provide a circuit module which easily allows control of the separation behavior of the metal layer on each of the side surface of the wiring structure and the side surface of the insulating resin layer.

According to an aspect of the present invention, there is provided a circuit module comprising: a wiring structure; an electronic component arranged on an upper surface of a wiring structure; an insulating resin layer which is provided on the upper surface of the wiring structure and in which the electronic component is embedded; and a metal layer provided on a side surface of the insulating resin layer and a side surface of the wiring structure. When the surface roughness of the side surface of the insulating resin layer is expressed as R1, and the surface roughness of the side surface of the wiring structure is expressed as R2, R1 and R2 differ from each other.

In the above circuit module, R1 and R2 differ from each other, with the result that the adherence between the side surface of the insulating resin layer and the metal layer is different from the adherence between the side surface of the wiring structure and the metal layer. The greater the surface roughness, the higher the adherence with respect to the metal layer. Thus, of the side surface of the wiring structure and the side surface of the insulating resin layer, the metal layer on the side surface of the one of greater surface roughness is less subject to separation than the metal layer on the side surface of the one of smaller surface roughness. In the case where the metal layer is separated through heat processing or the like, the metal layer on the side surface of the one of smaller surface roughness is separated. After this, due to the existence of a portion from which the metal layer has been separated, the stress applied to the metal layer is mitigated, and the metal layer on the side surface of the one of greater surface roughness becomes still harder to separate. In this way, in the above circuit module, R1 and R2 are different from each other, whereby of the side surface of the wiring structure and the side surface of the insulating resin layer, the metal layer on the side surface of the one of greater surface roughness can be made harder to separate, so that the control of the separation behavior of the metal layer on each side surface is easy to perform.

In a circuit module according to an aspect of the present invention, R1 and R2 may satisfy the condition: R2>R1. In this mode, the metal layer on the side surface of the wiring structure is harder to separate than the metal layer on the side surface of the insulating resin layer. Further, in the case where the metal layers are separated through heat processing or the like, the metal layer on the side surface of the insulating resin layer is first separated, and after this, the metal layer on the side surface of the wiring structure becomes still harder to separate. When the metal layer on the side surface of the wiring structure is hard to separate, the metal layer of this portion is easy to utilize as a grounding terminal or the like.

In a circuit module according to an aspect of the present invention, R1 and R2 may satisfy the condition: R1>R2. In this mode, the metal layer on the side surface of the insulating resin layer is easier to separate than the metal layer on the side surface of the wiring structure. In the case where the metal layers are separated through heat processing or the like, the metal layer on the side surface of the wiring structure is first separated, and after this, the metal layer on the side surface of the insulating resin layer becomes still harder to separate. When the metal layer on the side surface of the insulating resin layer is hard to separate, it is easy to achieve an improvement in terms of the electromagnetic shielding effect for the electronic component.

In a circuit module according to an aspect of the present invention, R1/R2 may range from 0.2 to 0.95. In this mode, the metal layer on the side surface of the wiring structure is still harder to separate.

In a circuit module according to an aspect of the present invention, R1/R2 may range from 1.05 to 10.5. In this mode, the metal layer on the side surface of the insulating resin layer is still harder to separate.

In accordance with the present invention, there is provided a circuit module allowing easy control of the separation behavior of the metal layer on each side surface of the wiring structure and the insulating resin layer.

BRIEF DESCRIPTION OF THE DRAWINGS

FIG. 3A is a schematic view of an example of a dicing blade. FIG. 3B is a sectional view, taken along line A-A of the dicing plate shown in FIG. 3A. FIG. 3C is a schematic view illustrating how dicing is performed by using the dicing blade shown in FIG. 3A.

FIG. 4A is a schematic view of another example of the dicing blade. FIG. 4B is a sectional view, taken along line B-B, of the dicing plate shown in FIG. 4A. FIG. 4C is a schematic view illustrating how dicing is performed by using the dicing blade shown in FIG. 4A.

DETAILED DESCRIPTION

Figure 1:
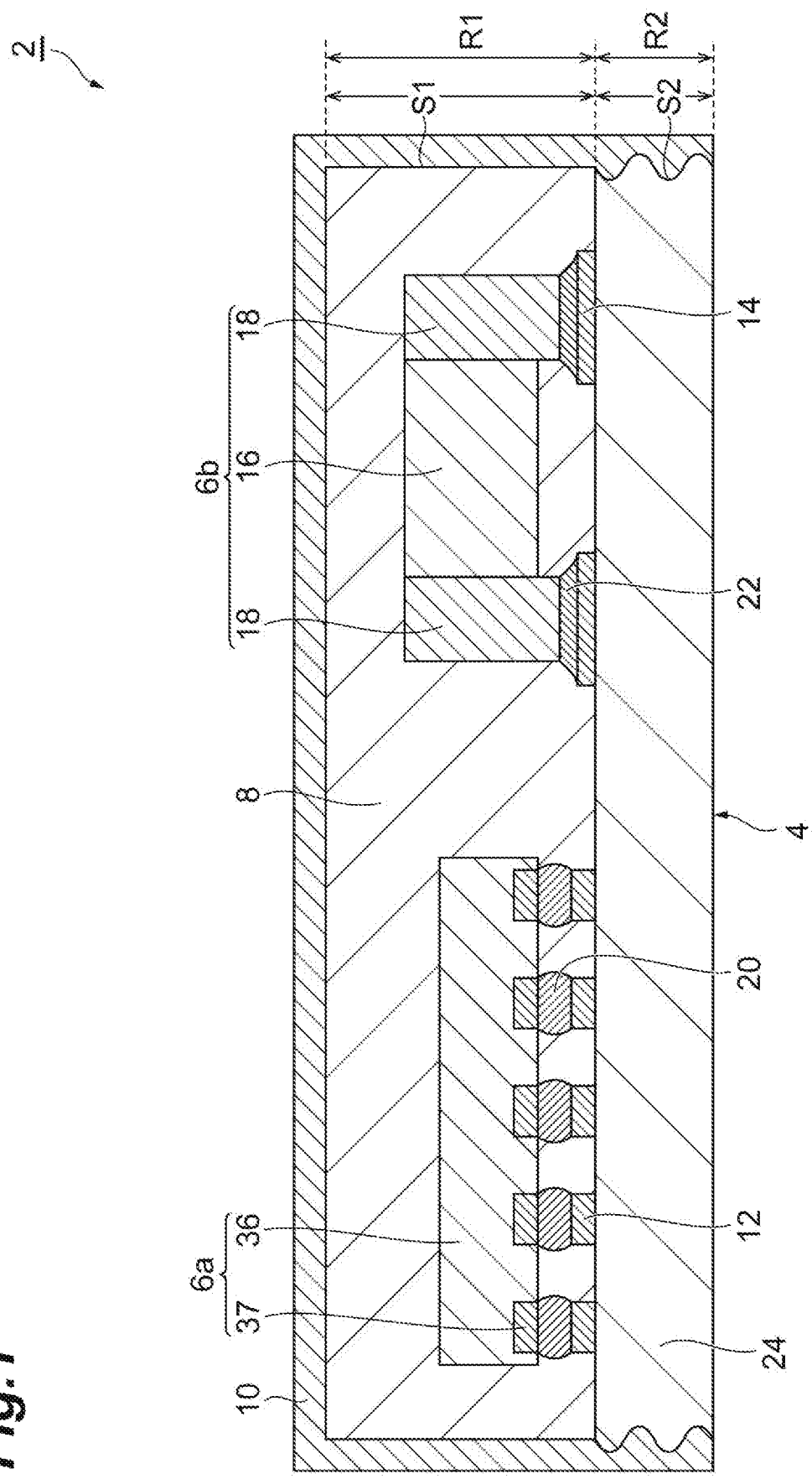
FIG. 1 is a sectional view of a circuit module according to an embodiment of the present invention.

In the following, preferred embodiments of the present invention will be described in detail. In the drawings, the same or equivalent components are designated by the same reference numerals. The upper limit value and the lower limit value of each value range given in the present specification allow arbitrary combination.

First Embodiment

A circuit module 2 according to a first embodiment will be described with reference to FIG. 1. The circuit module 2 is equipped with a wiring structure 4, electronic components 6a and 6b, connection portions 20 and 22, an insulating resin layer 8, and a metal layer 10.

The wiring structure 4 has an insulating layer 24, and a plurality of wiring layers 12 and 14 provided on the upper surface of the insulating layer 24. The material of the insulating layer 24 may, for example, be resin, ceramic, or resin-impregnated glass fiber. The resin may be epoxy resin, polyimide or the like. The ceramic may be alumina or the like. The ceramic may be LTCC (low temperature co-fired ceramics), HTCC (high temperature co-fired ceramics) or the like. The resin-impregnated glass fiber may be CCL (copper clad laminate) or the like. The material of the wiring layers 12 and 14 may be copper (Cu), nickel (Ni) or the like.

The electronic component 6a is arranged on the upper surface of the wiring structure 4. The electronic component 6a is equipped with a main body portion 36, and a plurality of terminal portions 37 provided on the back surface of the main body portion 36. Although not shown, the main body portion 36 is provided with an electric circuit electrically connected to each terminal portion 37.

The electronic component 6b is arranged on the upper surface of the wiring structure 4. The electronic component 6b is equipped with a main body portion 16, and a pair of terminal portions 18 respectively provided at both side end portions of the main body portion 16. Although not shown, the main body portion 16 is provided with an electric circuit electrically connected to each terminal portion 18.

Devices of the electronic components 6a and 6b may, for example, be capacitors, semiconductors, or SAW (surface acoustic wave) filters. The capacitor may be a laminated ceramic capacitor (MLCC: multi-layer ceramic capacitor) or the like. The electronic components 6a and 6b may be integrated circuits (IC).

Each connection portion 20 electrically connects each terminal portion 37 of the electronic component 6a and each wiring layer 12 of the wiring structure 4. In the present embodiment, the connection portion 20 can be formed through reflow of solder bumps provided at the terminal portions 37 of the electronic component 6a. Each connection portion 22 electrically connects each terminal portion 18 of the electronic component 6b and each wiring layer 14 of the wiring structure 4. The connection portions 22 can be formed through reflow of printing solder provided on the terminal portion 18 of the electronic component 6b.

The insulating resin layer 8 is provided on the upper surface of the wiring structure 4. The electronic components 6a and 6b are embedded in the insulating resin layer 8. The insulating resin layer 8 is a layer including resin. The resin may be epoxy resin or the like. The insulating resin layer 8 may consist solely of resin, or may include some other ingredient in addition to the resin. The insulating resin layer 8 may include, for example, filler.

The surface roughness of the side surface S1 of the insulating resin layer 8 is referred to as R1, and the surface roughness of the side surface S2 of the wiring structure 4 is referred to as R2. In the circuit module 2 of the first embodiment, R1 and R2 differ from each other, with R2 being larger than R1. In other words, R1 and R2 satisfy the condition: R2>R1.

Here, the surface roughness means the arithmetic average roughness Ra as specified in JIS B 0601:2013.

In the first embodiment, R1/R2 may range, for example, from 0.2 to 0.95, from 0.5 to 0.95, or from 0.5 to 0.9. In the case where R1/R2 is within the above ranges, the metal layer 10 on the side surface S2 of the wiring structure 4 is still harder to separate.

In the first embodiment, R1 may range, for example, from 0.1 to 0.25 μm. R2 may range, for example, from 0.15 to 0.40 μm. The surface roughness can be measured by using, for example, a configuration measurement laser microscope manufactured by KEYENCE Co., Ltd. (model: VK-X200). The lens magnification employed at this time may be ×20 or ×50. The measurement field of view may range, for example, from 150 μm×150 μm to 700 μm×500 μm. At the time of measurement, it is possible to provide, with respect to the measurement specimen, a cutoff wavelength λc distinguishing between surface roughness and warpage. λc may range from 50 to 300 μm.

The metal layer 10 is provided on the upper surface and the side surface of the insulating resin layer 8, and on the side surface of the wiring structure 4. The metal layer 10 functions as the electromagnetic shield or the wiring of the electronic component device. The metal layer 10 is a layer including a metal. There are no particular limitations regarding as the material of the metal layer 10 so long as it is a material of the electromagnetic shield or the wiring. The material of the metal layer 10 may, for example, be a material containing a conductive element such as Cu, Ni, Fe, or Ag or a magnetic element. The metal layer 10 may consist of a single layer, a plurality of layers, a resin-composite body or the like.

The circuit module 2 according to the first embodiment can be produced, for example, by the following method. The method of producing the circuit module 2, however, is not restricted to the following one.

First, there is prepared a combination of a sheet wiring structure and a plurality of electronic components 6a and 6b.

In the process described below, the sheet wiring structure is individualized, and the wiring structure 4 shown in FIG. 1 is formed.

Next, by the well-known reflow method or the like, the wiring layer of the sheet wiring structure and the terminal portions of the electronic components 6a and 6b are connected via the connection portions 20 and 22. After this, the insulating resin layer 8 is formed on the upper surface of the sheet wiring structure to seal the electronic components 6a and 6b, thereby obtaining a circuit module assembly having no metal layer 10. The method of forming the insulating resin layer 8 may, for example, be transfer molding, compression molding, printing, laminating, or casting.

Next, the assembly is individualized through dicing to obtain a circuit module having no metal layer 10. Here, when the surface roughness of the dicing blade used in the dicing is differentiated in the radial direction, it is possible to differentiate the surface roughness of the cut surface in the radial direction. For example, as shown in FIGS. 3A and 3B, the surface of the dicing blade 42 is divided into a central portion Sα having a radius L1 obtained by subtracting from the radius r of the blade a thickness h which is equal or not less than the thickness of the insulating resin layer 8, and an outer side portion Sβ provided outside of the central portion Sα. The surface roughness of the central portion Sα is referred to as Rα, and the surface roughness of the outer side portion sβ is referred to as Rβ. There is prepared a dicing blade 42 in which Rα is larger than Rβ. As shown in FIG. 3C, when the assembly is cut on a dicing tape 46 by using the dicing blade 42 from the sheet wiring structure side of the assembly (the back surface side of the sheet wiring structure), the outer side portion Sβ of the surface of the dicing blade 42 comes into contact with both the wiring structure 4 and the insulating resin layer 8, and the central portion Sα comes into contact solely with the wiring structure 4. As a result, the surface roughness R2 of the side surface S2 of the wiring structure 4 becomes larger than the surface roughness R1 of the side surface S1 of the insulating resin layer 8.

After this, the metal layer 10 is formed on the upper surface and the side surface of the insulating resin layer 8, and on the side surface of the wiring structure 4. The method of forming the metal layer 10 may be plating, sputtering or the like.

In the circuit module 2 of the first embodiment, the surface roughness R2 of the side surface S2 of the wiring structure 4 is greater than the surface roughness R1 of the side surface S1 of the insulating resin layer 8. As a result, the adherence between the side surface S2 of the wiring structure 4 and the metal layer 10 is higher than the adherence between the side surface S1 of the insulating resin layer 8 and the metal layer 10. Thus, the metal layer on the side surface S2 of the wiring structure 4 is harder to separate than the metal layer on the side surface S1 of the insulating resin layer 8. In the case where the metal layer 10 is separated by thermal stress due to heat processing or the like, the metal layer on the side surface S1 of the insulating resin layer 8 is first separated. After this, due to the presence of the portion where the metal layer 10 has been separated, the stress applied to the metal layer 10 is mitigated, and the metal layer on the side surface S2 of the wiring structure 4 becomes still harder to separate. When the metal layer on the side surface S2 of the wiring structure 4 is hard to separate, the metal layer of this portion can be easily utilized as a grounding terminal or the like.

Second Embodiment

Figure 2:
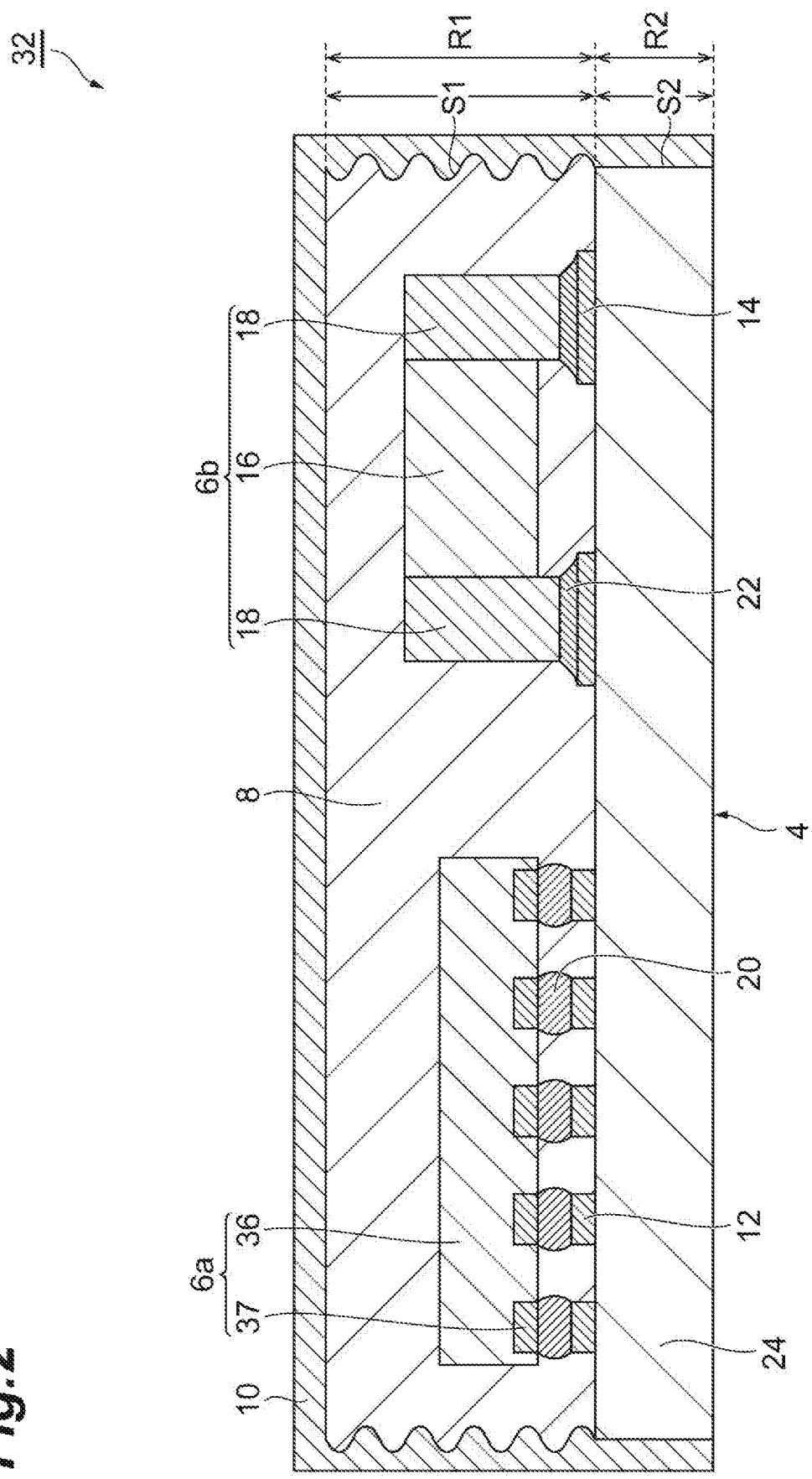
FIG. 2 is a sectional view of a circuit module according to an embodiment of the present invention.

A circuit module 32 according to a second embodiment will be described with reference to FIG. 2. Regarding the second embodiment, solely the differences from the first embodiment will be described. In the circuit module 32, the surface roughness R1 of the side surface S1 of the insulating resin layer 8 is larger than the surface roughness R2 of the side surface S2 of the wiring structure 4. In other words, R1 and R2 satisfy the condition: R1>R2.

In the second embodiment, R1/R2 may range, for example, from 1.05 to 10.5, from 1.05 to 9.5, or from 1.2 to 9.8. In the case where R1/R2 is within the above ranges, the metal layer 10 on the side surface S1 of the insulating resin layer 8 is still harder to separate.

In the second embodiment, R1 may range, for example, from 0.2 to 1.4 μm. R2 may range, for example, from 0.15 to 0.4 μm.

As shown in FIGS. 4A and 4B, in the production of the circuit module 32 of the second embodiment, the surface of a dicing blade 43 is divided into a central portion Sγ having a radius L2 obtained by subtracting a thickness t which is equal or not less than the thickness of the wiring structure 4 from the radius r of the dicing blade, and an outer side portion Sδ provided outside of the central portion Sγ. The surface roughness of the central portion Sγ is referred to as Rγ, and the surface roughness of the outer side portion Sδ is referred to as Rδ. There is prepared a dicing blade 43 in which Rγ is larger than Rδ. As shown in FIG. 4C, when, by using this dicing blade 43, the assembly is cut on the dicing tape 46 from the insulating resin layer 8 side (the upper surface side of the insulating resin layer 8) of the assembly, the outer side portion Sδ of the surface of the dicing blade 43 comes into contact with both the wiring structure 4 and the insulating resin layer 8, and the central portion Sγ comes into contact solely with the insulating resin layer 8. As a result, the surface roughness R1 of the side surface S1 of the insulating resin layer 8 becomes larger than the surface roughness R2 of the side surface S2 of the wiring structure 4.

In the circuit module 32 of the second embodiment, the surface roughness R1 of the side surface S1 of the insulating resin layer 8 is larger than the surface roughness R2 of the side surface S2 of the wiring structure 4. As a result, the adherence between the side surface S1 of the insulating resin layer 8 and the metal layer 10 is higher than the adherence between the side surface S2 of the wiring structure 4 and the metal layer 10. Thus, the metal layer 10 on the side surface S1 of the insulating resin layer 8 is harder to separate than the metal layer 10 on the side surface S2 of the wiring structure 4. In the case where the metal layer 10 is separated by the thermal stress due to heat processing or the like, the metal layer 10 on the side surface S2 of the wiring structure 4 is first separated. After this, due to the presence of the portion where the metal layer 10 has been separated, the stress applied to the metal layer 10 is mitigated, and the metal layer 10 on the side surface S1 of the insulating resin layer 8 becomes still harder to separate. When the metal layer 10 on the side surface S1 of the insulating resin layer 8 is hard to separate, the electromagnetic shielding effect for the electronic components 6a and 6b is easily improved.

The present invention is not restricted to the embodiment thereof described in detail above.

For example, in the circuit module 2 of the first embodiment, a wiring layer may be further provided on the lower surface of an insulating layer 24 that the wiring structure 4 has. The wiring layer may be further provided in the insulating layer 24. The wiring structure 4 may be a single-layer wiring structure or a multi-layer wiring structure (build-up wiring structure). The wiring structure 4 may be further equipped with an insulating covering layer provided on the upper surface of the insulating layer 24. The insulating covering layer may cover a part of the wiring layers 12 and 14. The insulating covering layer may be a solder resist layer or the like. Further, a solder bump may be further provided on the back surface of the wiring structure 4.

While in the circuit module 2 the number of electronic components is two, the number may be one or three or more. There are no particular restrictions regarding the size and configuration of the electronic components. Nor are there any particular restrictions regarding the number of terminal portions of the electronic components, the number of wiring layers of the wiring structure, and the number of connection portions.

While in the production process of the circuit module 2 the surface roughness R2 of the side surface S2 of the wiring structure 4 is adjusted by the dicing blade used for the dicing of the assembly, R2 may be adjusted through forming unevenness on the side surface S2 of the wiring structure 4 after individualizing the assembly. Further, instead of using the sheet wiring structure, it is also possible to use a wiring structure 4 in which R2 is previously adjusted.

While in the circuit module 2 the metal layer 10 is provided on the upper surface and the side surface of the insulating resin layer 8 and on the side surface of the wiring structure 4, it is only necessary for the metal layer to be provided at least on the side surface of the insulating resin layer 8 and on the side surface of the wiring structure 4.

While in the production process of the circuit module 32 of the second embodiment the surface roughness R1 of the side surface S1 of the insulating resin layer 8 is adjusted by a dicing blade used for the dicing of an assembly, R1 may be adjusted through forming of unevenness on the side surface S1 of the insulating resin layer 8 after individualizing the assembly.

The circuit module 32 can be carried out by some other assembly individualizing method than dicing. In this case, the insulating resin layer 8 containing filler is formed, and the assembly is cut by laser. Then, the filler is exposed in the cut surface of the insulating resin layer 8, whereby it is possible to form unevenness on the side surface S1 of the insulating resin layer 8. As a result, it is possible to adjust the surface roughness R1 of the side surface S1 of the insulating resin layer 8. In the case where instead of employing a sheet wiring structure, the wiring structure 4 is used from the first, for example, the surface of the mold forming the insulating resin layer 8 is previously provided with unevenness at positions corresponding to the side surface S1 of the insulating resin layer 8. Then, it is possible to form unevenness on the side surface S1 of the insulating resin layer 8. As a result, it is possible to adjust R1.

REFERENCE SIGNS LIST 2, 32 . . . circuit module, 4 . . . wiring structure, 6a, 6b electronic component, 8 . . . insulating resin layer, 10 . . . metal layer, 12, 14 . . . wiring layer, 16, 36 . . . main body portion, 18, 37 . . . terminal portion, 20, 22 . . . connection portion, 24 . . . insulating layer, 42, 43 . . . dicing blade, 46 . . . dicing tape.

What is claimed is:

1. A circuit module comprising:
   a wiring structure;
   an electronic component arranged on an upper surface of the wiring structure;
   an insulating resin layer which is provided on the upper surface of the wiring structure and in which the electronic component is embedded; and
   a metal layer provided on a side surface of the insulating resin layer and a side surface of the wiring structure,
   wherein when the surface roughness of the side surface of the insulating resin layer is expressed as R1, and the surface roughness of the side surface of the wiring structure is expressed as R2, R1 and R2 differ from each other.

2. The circuit module according to claim 1, wherein R1 and R2 satisfy the condition: R2>R1.

3. The circuit module according to claim 1, wherein R1 and R2 satisfy the condition: R1>R2.

4. The circuit module according to claim 2, wherein R1/R2 ranges from 0.2 to 0.95.

5. The circuit module according to claim 3, wherein R1/R2 ranges from 1.05 to 10.5.

* * * * *